(12) United States Patent
Nakanishi et al.

(10) Patent No.: US 10,632,587 B2
(45) Date of Patent: Apr. 28, 2020

(54) POLISHING APPARATUS AND POLISHING METHOD

(71) Applicant: EBARA CORPORATION, Tokyo (JP)

(72) Inventors: Masayuki Nakanishi, Tokyo (JP);
Toshifumi Watanabe, Tokyo (JP);
Kenji Kodera, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 122 days.

(21) Appl. No.: 15/564,417

(22) PCT Filed: Jan. 6, 2017

(86) PCT No.: PCT/JP2017/000195
§ 371 (c)(1),
(2) Date: Oct. 4, 2017

(87) PCT Pub. No.: WO2017/122580
PCT Pub. Date: Jul. 20, 2017

(65) Prior Publication Data
US 2018/0133861 A1 May 17, 2018

(30) Foreign Application Priority Data
Jan. 14, 2016 (JP) .................... 2016-005185

(51) Int. Cl.
*B24B 49/12* (2006.01)
*B24B 9/06* (2006.01)
(Continued)

(52) U.S. Cl.
CPC ............ *B24B 9/065* (2013.01); *B24B 21/002* (2013.01); *B24B 49/12* (2013.01); *H01L 21/304* (2013.01)

(58) Field of Classification Search
CPC .......... B24B 9/065; B24B 9/06; B24B 49/12; B24B 21/002; B24B 21/00; H01L 21/304
(Continued)

(56) References Cited

U.S. PATENT DOCUMENTS

2008/0200100 A1* 8/2008 Takahashi ............... B24B 9/065
451/44
2011/0237164 A1 9/2011 Seki et al.

FOREIGN PATENT DOCUMENTS

GB  2337111 A  10/1999
JP  2004-200527 A  7/2004
(Continued)

OTHER PUBLICATIONS

European Patent Application No. 17738335.3; Extended Search Report; dated Nov. 21, 2018; 7 pages.
(Continued)

*Primary Examiner* — Robert A Rose
(74) *Attorney, Agent, or Firm* — BakerHostetler

(57) ABSTRACT

To provide a polishing apparatus capable of polishing bevel portions of varying shape by selecting a suitable polishing recipe, based on a state before polishing.
The polishing apparatus 100 comprises: a holding/polishing unit 102 for holding and polishing a workpiece W1; and an identifying unit 104 for identifying data 104a associated with a state of the peripheral portion of the substrate W1 before polishing. The holding/polishing unit 102 comprises: a holder 106 for holding and rotating the substrate W1; and a polisher 108 for polishing the peripheral portion of the substrate W1 by pressing a polishing member against the peripheral portion. A polishing-condition determiner 110 determines a polishing condition, based on data 104a indicating to which type, of a plurality of shape-related types, the shape of a given peripheral portion belongs.

10 Claims, 9 Drawing Sheets

(51) Int. Cl.
  *H01L 21/304* (2006.01)
  *B24B 21/00* (2006.01)
(58) Field of Classification Search
  USPC ...................................... 451/44, 168, 173, 5
  See application file for complete search history.

(56) References Cited

FOREIGN PATENT DOCUMENTS

| | | |
|---|---|---|
| JP | 2008-042213 A | 2/2008 |
| JP | 2008-537316 A | 9/2008 |
| JP | 2009-111079 A | 5/2009 |
| JP | 2011-161625 A | 8/2011 |
| JP | 2014-117782 A | 6/2014 |
| WO | WO 2006/112530 A1 | 10/2006 |

OTHER PUBLICATIONS

International Patent Application No. PCT/JP2017/000195; Int'l Search Report; dated Mar. 14, 2017; 2 pages.

* cited by examiner

POLISHING APPARATUS AND POLISHING METHOD

CROSS-REFERENCE TO RELATED APPLICATIONS

This application is a 371 U.S. National Stage Application of Patent Application No. PCT/JP2017/000195, filed Jan. 6, 2017, which claims priority to Japanese Patent Application No. 2016-005185, filed Jan. 14, 2016. The entire contents of which are hereby incorporated by reference.

TECHNICAL FIELD

The present invention relates to a polishing apparatus and a polishing method for polishing a peripheral portion of a workpiece, such as a semiconductor wafer.

BACKGROUND ART

From a viewpoint of improving yield in fabrication of semiconductor devices, management of surface conditions of a peripheral portion of a substrate, such as a semiconductor wafer, has been attracting attention in recent years. In the fabrication process of the semiconductor devices, many materials are deposited on a silicon wafer to form a multilayer structure. Therefore, unwanted films and roughened surface are formed on a peripheral portion which is not used for products. It has been a recent trend to transport the substrate by holding only its peripheral portion using arms. Under such circumstances, the unwanted films remaining on the peripheral portion would be peeled off during various processes and could adhere to devices, causing lowered yield. Thus, a polishing apparatus for polishing the peripheral portion of the substrate has been used in order to remove the unwanted films and roughened surface therefrom.

An apparatus using a polishing tape as described in JP-A-2011-161625 for polishing the peripheral portion of the substrate is known as such a polishing apparatus. This type of polishing apparatus polishes the peripheral portion of the substrate by bringing a polishing surface of the polishing tape in sliding contact with the peripheral portion of the substrate. In this specification, the peripheral portion is defined as a region including a bevel portion which is the outermost portion of the substrate and a top edge portion and bottom edge portion located radially inwardly of the bevel portion.

FIG. 1A and FIG. 1B are enlarged cross-sectional views each showing a peripheral portion of a substrate. More specifically, FIG. 1A shows a cross-sectional view of a so-called straight-type substrate, and FIG. 1B shows a cross-sectional view of a so-called round-type substrate. In the substrate W1 shown in FIG. 1A, the bevel portion is a portion BB that is constituted by a top incline (a top bevel portion) PP, a bottom incline (a bottom bevel portion) Q1, and a side portion (an apex) RR, all of which form an outermost circumferential surface of the substrate W1. In the substrate W shown in FIG. 1B, the bevel portion is a portion BB having a curved cross section and forming an outermost circumferential surface of the substrate W1. The top edge portion is a flat portion E1 located radially inwardly of the bevel portion BB and located radially outwardly of a region D1 where devices are formed. The bottom edge portion is a flat portion E2 located opposite the top edge portion and located radially inwardly of the bevel portion BB. These top edge portion E1 and bottom edge portion E2 may be collectively referred to as near-edge portions.

In bevel polishing, a surface of a peripheral substrate portion is polished by pressing diamond polishing tape or the like, a polishing member, of a polisher against the surface, while rotating the substrate in a circumferential direction. For this reason, polishing conditions vary, in some cases, with the shape of the peripheral substrate portion before polishing.

To use the polishing tape, operators take measurements of a bevel portion before polishing and set up from experience a polishing condition (polishing recipe) that suit the bevel shape and check whether the polishing condition does not cause any problem, by actually polishing a substrate. Having made sure that there is no problem, the operators start processing several substrates continuously.

The shape of a bevel portion of a semiconductor wafer varies with its manufacturer. To ensure a stable supply of semiconductor wafers, semiconductor manufacturers sometimes purchase semiconductor wafers from several different semiconductor wafer manufacturers. In some cases, semiconductor manufacturers use semiconductor wafers of varying bevel shape, depending on the type of device. For this reason, semiconductor wafers running on a semiconductor-circuit production line vary in bevel shape from lot to lot or individually.

In such a case of wafers of varying bevel shape, considering a processing recipe every time the wafer shape changes gives much trouble to the operators who use the polishing apparatus, and results in an increase in downtime of the polishing apparatus.

CITATION LIST

Patent Literature

PTL 1: JP-A-2011-161625

SUMMARY OF INVENTION

Technical Problem

The present invention is made in view of the above-described problem with the prior art. An object of the present invention is to provide a polishing apparatus that is capable of polishing with an appropriate polishing recipe selected on the basis of a state prior to polishing, even in the case of varying bevel shape. Another object of the present invention is to provide a polishing method using such a polishing apparatus.

Solution to Problem

To solve the above-described problem, a polishing apparatus of a first configuration comprises: a holder for holding a workpiece; a polishing member for polishing a peripheral portion of the workpiece while the polishing member is pressed against the peripheral portion; a polishing-condition determiner for determining a polishing condition, based on data associated with a state of the peripheral portion before the polishing, to suit the state; and a controller for controlling the polishing member to polish the workpiece in accordance with the polishing condition.

This configuration makes it possible to select a suitable polishing condition, based on data associated with a state of a given peripheral portion before polishing, even if the state (e.g., shape) of peripheral portions of workpieces may vary. This reduces the occurrence of defective polishing, the trouble the user has to go through in using the apparatus, and downtime of the polishing apparatus.

In a second configuration, the data indicates to which type, of a plurality of state-related types, the state of the peripheral portion belongs.

This configuration makes it possible for the polishing-condition determiner to determine a polishing condition that suits a given state, provided that polishing conditions for conceivable types of state of workpieces are determined in advance through experimentation or the like.

In a third configuration, the state of the peripheral portion is a shape of the peripheral portion.

In a fourth configuration, the data associated with the shape of the peripheral portion is obtained by a confocal laser microscope.

In a fifth configuration, the data associated with the shape of the peripheral portion is obtained by a telecentric optical system.

In a sixth configuration, the state of the peripheral portion is the state of a substance attached to the peripheral portion.

In a seventh configuration, the polishing apparatus further comprises a polishing-termination determiner that, after the polisher polishes the workpiece, determines whether to terminate the polishing, based on data associated with a state of the peripheral portion after polishing.

In an eighth configuration, the peripheral portion of the workpiece is a bevel portion that is an end face of the peripheral portion of the workpiece.

In a ninth configuration, the polishing apparatus further comprises an identifying unit that identifies data associated with the state of the peripheral portion before the polishing and transmits the data obtained to the polishing-condition determiner.

This configuration makes it possible, even if the state of peripheral portions of workpieces vary, to select a suitable polishing condition, using the identifying unit that identifies the unpolished state of the peripheral portion before polishing starts.

In a tenth configuration, a polishing method for polishing a peripheral portion of a workpiece against which portion a polishing member is pressed, while the workpiece is held and rotated, comprises: determining a polishing condition, based on data associated with a state of the peripheral portion before the polishing, to suit the state; and polishing the workpiece in accordance with the polishing condition.

BRIEF DESCRIPTION OF DRAWINGS

FIG. 1 B is an enlarged cross-sectional view of a peripheral portion of a substrate.

DESCRIPTION OF EMBODIMENTS

One embodiment of the present invention will now be described with reference to the accompanying drawings.

Figure 2:
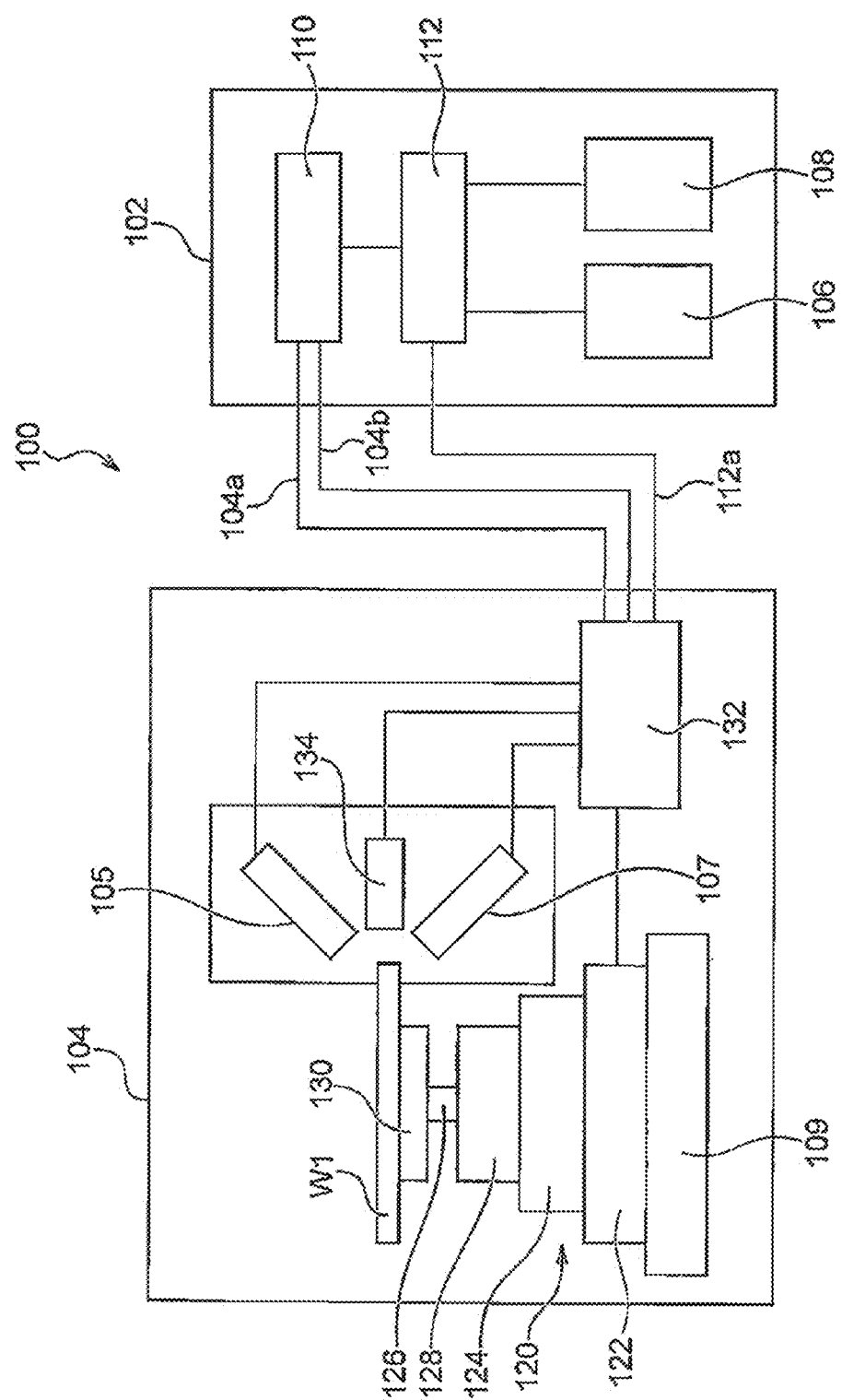
FIG. 2 is a block diagram of a polishing apparatus according to one embodiment of the present invention.

FIG. 2 is a block diagram of a polishing apparatus 100 of this embodiment of the present invention. The polishing apparatus 100 is a bevel polishing apparatus suitable for polishing a bevel portion of a substrate. One example of a substrate to be polished is a semiconductor wafer of 300 mm in diameter with film thereon.

The polishing apparatus 100 comprises: a holding/polishing unit 102 for holding and polishing a substrate W1 (workpiece); and an identifying unit 104 for identifying data 104a associated with the state of a peripheral portion of the wafer W1 before polishing. The holding/polishing unit 102 comprises: a holder 106 for holding and rotating the substrate W1; and a polisher (polishing head) 108 provided with a polishing member for polishing a peripheral portion while the polishing member is pressed against the peripheral portion of the substrate W1. The identifying unit 104 transmits obtained data 104a to a polishing-condition determiner 110.

The holding/polishing unit 102 further comprises: the polishing-condition determiner 110 for determining a polishing condition, based on the data 104a associated with the state of the peripheral portion before polishing, to suit the state of the peripheral portion; and a control unit 112 for controlling the polishing member to polish the substrate W1 in accordance with the polishing conditions. The polishing-condition determiner 110 receives the data 104a on the state of the peripheral portion before polishing from the identifying unit 104.

In this embodiment, the state of the peripheral portion before polishing refers to the shape of the peripheral portion. In this embodiment, the peripheral portion of the substrate W1 to be polished is a bevel portion BB which is an end face of the peripheral portion of the substrate W1. The peripheral portion of the substrate W1 to be polished by the present invention is not limited to a bevel portion and may be a top edge portion E1 and a bottom edge portion E2.

The state of the peripheral portion before polishing according to the present invention may be a state of a substance attached to the peripheral portion. The state of a substance attached to the peripheral portion refers to a state (amount, location, or the like) of a substance, such as unwanted film or dust, remaining on the peripheral portion.

The identifying unit 104 also identifies data 104b associated with the state of the peripheral portion after polishing. The identifying unit 104 transmits the data 104b obtained to the polishing-condition determiner 110.

The identifying unit 104 determines to which type, of a plurality of state-related types, the state of the peripheral portion before polishing belongs and transmits the resultant type information as data 104a to the polishing-condition determiner 110. The polishing-condition determiner 110 uses the data 104a, or the type determined, to determine a polishing condition. The polishing-condition determiner 110 also has the function of a polishing-termination determiner that determines, after the polisher 103 polishes the substrate W1, whether to terminate polishing on the basis of the data 104b on the state of the peripheral portion after polishing.

The details of this embodiment are as follows. Before polishing the bevel portion of the substrate W1, the identifying unit 104 accurately measures and identifies the cross-sectional shape of an end face of the substrate W1. The identifying unit 104 classifies the shape by type (e.g., as one of five types). The polishing-condition determiner 110 uses the type information to select a processing recipe from the group of processing recipes prepared in advance for respective types.

The polishing-condition determiner 110 transmits the processing recipe so selected to the control unit 112. The control unit 112 automatically carries out a polishing process by controlling the polisher 108 in accordance with the selected processing recipe.

The polishing condition dictated by the processing recipe is polishing time, the polishing angle between the polishing head and the substrate W1, the rotating speed of the substrate W1, pressure exerted in polishing, the rate of feeding polishing tape, or the like. The contents of such processing recipes are determined for types A, B, C, D, and E, which will be described later, by experimentation or the like in advance.

First, the identifying unit 104 will be described. The identifying unit 104 three-dimensionally measures the shape of the surface of an end of the substrate W1, using confocal laser microscopes 105 and 107. A recognition system using a confocal optical system, such as the confocal laser microscopes 105 and 107, projects laser light from a laser light source through an objective lens to a sample surface and uses a one-dimensional image sensor to receive the light reflected from the sample.

In the confocal optical system, reflected light of maximum brightness enters a light-sensitive element only when the focal point of a scanning beam lies on the substrate W1, and the amount of reflected light entering the light-sensitive element drops rapidly as the focal point deviates from the surface of the substrate W1. The cross-sectional shape of the substrate W1 can thus be determined from information on the location on the substrate W1 where the brightness of light reflected from the surface of the substrate W1 is maximum by moving the substrate W1 while the confocal optical system is held stationary.

The substrate W1, after going through a preliminary process of bevel polishing, is carried on an unillustrated carrier onto a three-dimensional displacement mechanism 120 on a base 109. The base 109 is secured to a frame (not shown) of the identifying unit 104. The three-dimensional displacement mechanism 120 comprises: an XY stage 122 for XY-direction positioning on a horizontal plane; a Z stage 124 for positioning in Z direction, or in height; a θ stage 128 for setting a position of rotation around a rotating shaft 126. On the rotational shaft 126 sits a wafer attachment table 130. The wafer W1 is fixedly held by vacuum on the wafer attachment table 130. The XY stage 122, the Z stage 124, and the θ stage 128 are controlled in displacement by a controller 132.

The location on the substrate W1 where the brightness of light from the confocal laser microscopes 105 and 107 is maximum, that is, the brightest location on the substrate W1, represents positional information on the surface of the substrate W1. The controller 132 can thus obtain positional information on the substrate W1 by recording information on the positions of the XY stage 122, the Z stage 124, and the θ stage 128 when the brightness reaches the maximum. As the substrate W1 is moved relative to the confocal laser microscopes 105 and 107, the position of maximum brightness is recorded and stored. This makes it possible to obtain the shape (cross-sectional shape) of the surface of the substrate W1. The controller 132 classifies the cross-sectional shape so obtained as one of a plurality of types to produce the data 104a indicating to which of a plurality of types related to cross-sectional shape the cross-sectional shape of the peripheral portion belongs.

The identifying unit 104 of this embodiment comprises a memory and a CPU which serve as the controller 132 as they execute a pre-stored program. At least part of the functional part of the controller 132 may be constituted by a dedicated hardware circuit.

Figure 3A:
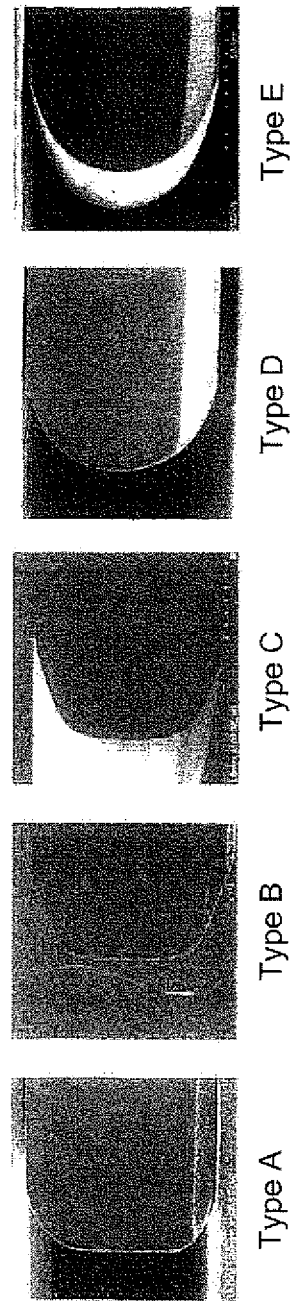
FIG. 3A shows different types related to the embodiment of the present invention.
Figure 3B:
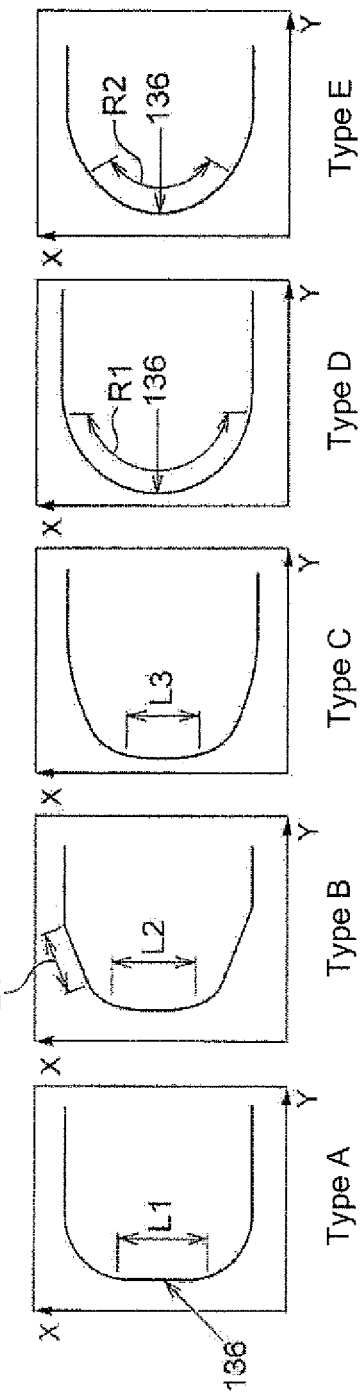
FIG. 3B shows different types related to the embodiment of the present invention.

An example of the data 104a is shown in FIGS. 3A and 3B. FIGS. 3A and 3B show five types of cross-sectional shape. The present invention is not limited to the five types, and there may be more than five types or less. The number of such types depends on the type of the substrate W1 to be handled by the apparatus of the present invention and the user's manufacturing process using the apparatus. In FIGS. 3A and B, the data 104a is of type A, B, C, D, or E. FIG. 3A are photos of the cross-sectional shapes of these types, and FIG. 3B shows data on the cross-sectional shapes corresponding to types A, B, C, D, and E. More specifically, the data on cross-sectional shape is a collection of two-dimensional numerical data indicating the position of a portion of high brightness (a collection of a plurality of sets of X- and Y-coordinate data).

There are various possible ways (image recognition techniques) of dividing cross-sectional shapes into types A, B, C, D, and E. For an example, the following steps may be taken: In step (1), cross-sectional shapes are divided into the group of types A, B, and C and the group of types D and E, depending on whether each cross-sectional shape has a straight line L1, L2, or L3 at its center 136. In subsequent step (2), cross-sectional shapes are divided into the group of types A and B and into type C by length, that is, depending on whether they have the length of L1, L2, or L3. In step (3), cross-sectional shapes are divided into type A and type B, depending on whether they have a slanted straight line L4. In step (4), cross-sectional shapes are divided into type D and type E, depending on whether they have the length of a curved line R1 or R2.

In another possible example, numerical data on typical cross-sectional shapes of types A, B, C, D, and E are stored beforehand in template form in the identifying unit 104, and the sum of the products of the template and data on a recognized cross-sectional shape is calculated to determine a degree of similarity (template matching technique). The type of a cross-sectional shape is identified by determining where the sum of values is highest.

The controller 132 determines the type of shape of a peripheral portion and transmits the type identification information (information indicating type A, B, C, D, or F) as data 104 related to the state of the peripheral portion before polishing to the polishing-condition determiner 110.

The confocal laser microscope 105 measures the top surface of the substrate W1, and the confocal laser microscope 107 measures the bottom surface of the substrate W1. The identifying unit 104 of the present invention is not limited to the three-dimensional measurement of the surface shape of an end of the substrate W1 with the confocal laser microscopes 105 and 107 and may use, for example, a telecentric optical system. With the telecentric optical system, chief rays can be regarded as parallel to the optical axis on one side of the lens, such that the size of an image does not vary even if it is out of focus and blurry. The telecentric optical system uses a CCD camera. The apparent size of an image of a subject produced by the telecentric optical system remains the same whether the subject is far away or nearby The telecentric optical system, since it keeps image size constant without any change, is an ideal optical system for image recognition and image processing and is thus capable of detecting an edge (the surface shape of the substrate W1) in an image. Image signals from the CCD camera are converted into grayscale data in accordance with brightness, the peak of which data is identified as an edge position. Since the edge position is determined, not from the absolute level of brightness or darkness, but from the rate of change in brightness or darkness, the detection of the edge position is less affected by varying illumination, surface reflectivity, or the like and can thus be made reliably.

The CCD camera 134 of the identifying unit 104 identifies data 104b (color image) associated with the state of the peripheral portion after polishing. The state of the peripheral portion after polishing taken with the CCD camera 134 is the state of a substance attached to the peripheral portion after polishing. In other words, the polishing-termination determiner 110 determines by color the state of a substance attached to the peripheral portion after polishing, that is, the state (amount, location, or the like) of a substance remaining on the peripheral portion, such as unwanted film, dust, or the like. The controller 132 transmits an obtained color image as the data 104b to the polishing-termination determiner 110. The polishing-termination determiner 110 determines that polishing should be terminated, for example when a certain color is faded below a predetermined level or cannot be detected.

The holding/polishing unit 102 will now be described. The polishing-condition determiner 110 of the holding/polishing unit 102 receives data 104a associated with the state of the peripheral portion before polishing from the controller 132 of the determiner 104.

The polishing-condition determiner 110 determines a polishing condition on the basis of the type identified. Based on the type information, the polishing-condition determiner 110 selects a processing recipe for that type from the group of processing recipes prepared in advance for respective types. The polishing-condition determiner 110 transmits the selected processing recipe to the control unit 112. The control unit 112 automatically performs polishing by controller the polisher 108 in accordance to the selected processing recipe.

The holding/polishing unit 102 of this embodiment comprises a memory and a CPU which serve as the polishing-condition determiner 110, the polishing-termination determiner 110, and the control unit 112 as they execute a pre-stored program. At least part of the functional part of the polishing-condition determiner 110, the polishing-termination determiner 110, and the control unit 112 may be constituted by a dedicated hardware circuit.

The details of a polishing process will now be described that is performed with the holder 106 for holding and rotating the substrate W1 and the polisher 108 for polishing the peripheral portion, with the polishing head pressed on the peripheral portion of the substrate W1.

Figure 4:
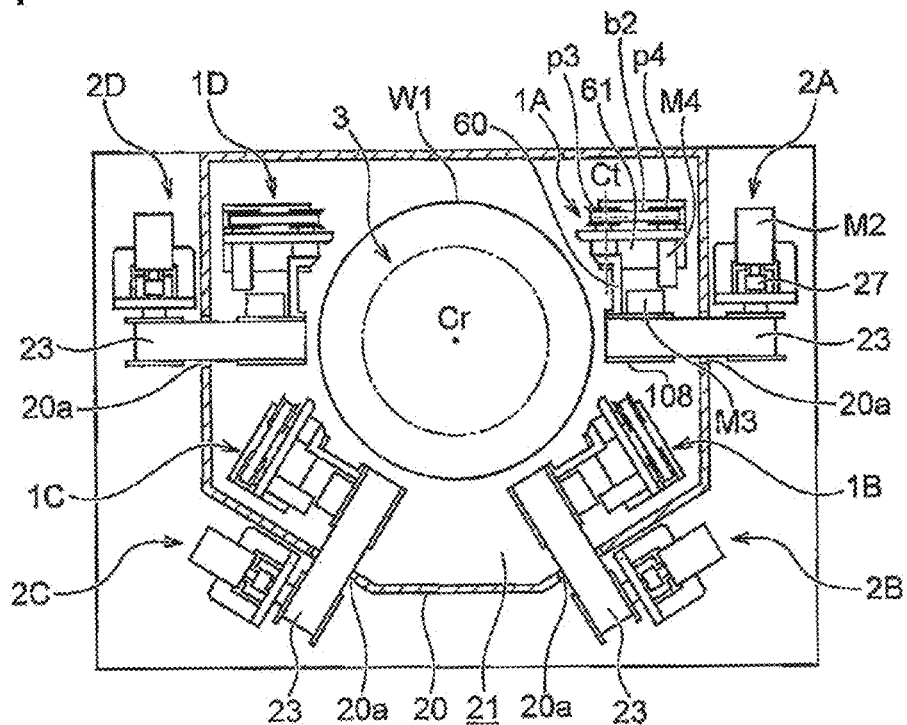
FIG. 4 is a plan view of a holding/polishing unit according to the embodiment.
Figure 5:
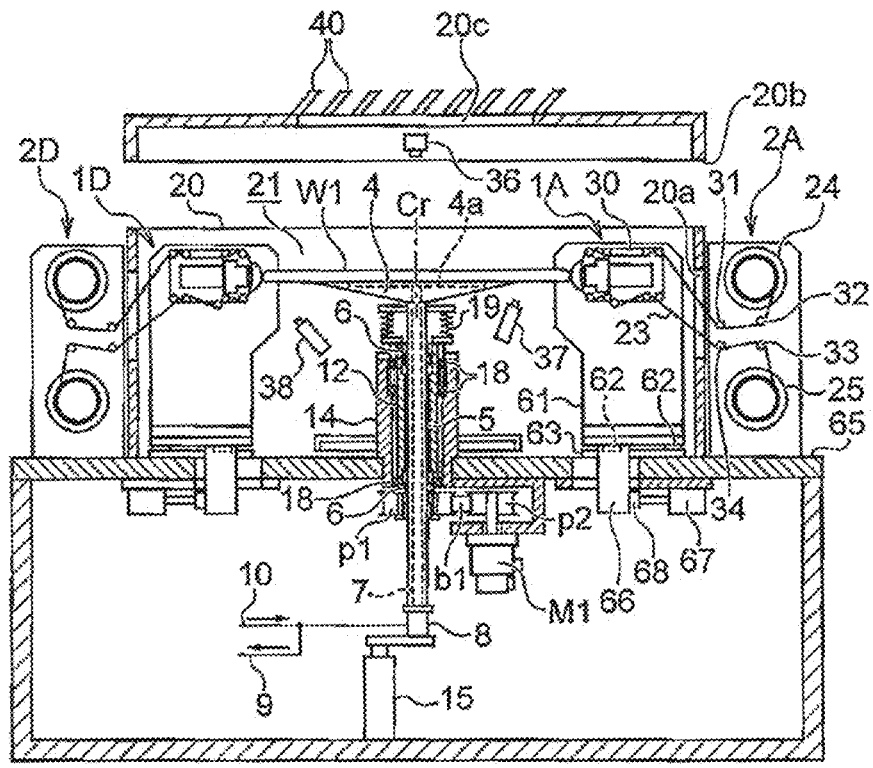
FIG. 5 is a longitudinal cross-sectional view of the polishing apparatus of FIG. 4.

FIG. 4 is a plan view of the holder 106 and the polisher 108 of one embodiment of the present invention. FIG. 5 is a longitudinal cross-sectional view of the holder 106 and the polisher 108 of FIG. 4. As shown in FIGS. 4 and 5, this apparatus comprises a rotating/holding mechanism (holder) 106 for horizontally holding the substrate W1, a workpiece, at its center and rotating it. The substrate W1, the cross-sectional shape of which has been identified by the identifying unit 104, is carried on an unillustrated carrier from the identifying unit 104 to a holding stage 4 of the rotating/holding mechanism 106.

FIG. 4 shows how the substrate W1 is held by the rotating/holding mechanism 106. The holding/rotating mechanism 106 comprises, at least: the holding stage 4, dish-shaped, for holding the rear surface of the substrate W1 by vacuum suction; a hollow shaft 5 connected to a central portion of the holding stage 4; and a motor M1 for rotating the hollow shaft 5. The substrate W1 is placed on the holding stage 4 by a hand (not shown) of the carrier so that the center of the substrate W1 coincides with the axial center of the hollow shaft 5. The rotating/holding mechanism 106 of this embodiment further comprises the following constituent elements.

The hollow shaft 5 is supported by a ball/spline bearing (linear-motion bearing) 6 to move vertically. The holding stage 4 has a groove 4a on the top surface, the groove 4a leading to a communication passage 7 extending through the hollow shaft 5. The communication passage 7 is connected to a vacuum line 9 via a rotary joint 8 attached to the bottom end of the hollow shaft 5. The communication passage 7 is also connected to a nitrogen-gas supply line 10 for removing the substrate W1 that has been processed, from the holding stage 4. The vacuum line 9 and the nitrogen-gas supply line 10 are alternately used to draw the substrate W1 to the top of the holding stage 4 by vacuum and remove it.

The hollow shaft 5 is rotated by the motor M1 via a pulley p1 coupled to the hollow shaft 5, a pulley p2 attached to a rotary shaft of the motor M1, and a belt b1 hung on the pulleys p1 and p2. The rotary shaft of the motor M1 extends parallel to the hollow shaft 5. With this arrangement, the substrate W1 held on the top of the holding stage 4 is rotated by the motor M1.

The ball/spline bearing 6 permits the hollow shaft 5 to move freely in its longitudinal direction. The ball/spline bearing 6 is secured to a cylindrical casing 12. In this way, the hollow shaft 5 of this embodiment is allowed to move up and down along a straight line relative to the casing 12 and rotates with the casing 12. The hollow shaft 5 is connected to an air cylinder (vertically moving mechanism) 15, which moves the hollow shaft 5 and the holding stage 4 up and down.

There is a radial bearing 18 between the casing 12 and a cylindrical casing 14 disposed on the outside of and coaxially with the casing 12, such that the casing 12 is rotatably supported by the bearing 18. The rotating/holding mechanism 106 is thus enabled to rotate the substrate W1 around its central axis Cr and move it up and down along the central axis Cr.

As shown in FIG. 4, substrate W1, held on the rotating/holding mechanism 16, is surrounded by four polishing-head assemblies 1A, 1B, 1C, and 1D. On the radially outside of the polishing-head assemblies 1A, 1B, 1C, and 1D are disposed polishing-tape supply mechanisms 2A, 2B, 2C, and 2D, respectively. The polishing-head assemblies 1A, 1B, 1C, and 1D and the polishing-tape supply mechanisms 2A, 2B, 2C, and 2D are separated by a partition wall 20. The partition wall 20 defines a polishing chamber 21 therein that houses the four polishing-head assemblies 1A, 1B, 1C, and 1D and the holding stage 4 therein. The polishing-tape supply mechanisms 2A, 2B, 2C, and 2D are outside the partition wall 20 (i.e., outside the polishing chamber 21). The polishing-head assemblies 1A, 1B, 1C, and 1D have the same structure, and so do the polishing-tape supply mechanisms 2A, 2B, 2C, and 2D. Below, the polishing-head assembly 1A and the polishing-tape supply mechanism 2A will be described.

The polishing-tape supply mechanism 2A comprises: a feed reel 24 for feeding polishing tape (polishing member) 23 to the polishing-head assembly 1A; and a take-up reel 24 for taking up the polishing tape 23 that has been used to polish the substrate W1. The Feed reel 24 is disposed above the take-up reel 25. The feed reel 24 and the take-up reel 25 are connected via couplings 27 to respective motors M2 (FIG. 4 shows only the coupling 27 connected to the feed reel 24, and the motor M2). The motors M2 apply a set amount of torque in a predetermined rotational direction to create a certain level of tension in the polishing tape 23.

The polishing tape 23 is a polishing tool in the shape of a long band with a polishing surface on one side. The polishing tape 23 comprises: a tape substrate made of a PET sheet or the like; and a polishing layer formed on the tape substrate. The polishing layer comprises: a binder (e.g., resin) coated on one side of the tape substrate; and abrasive grains held on the binder. A surface of the polishing layer forms a polishing surface. The polishing tape may be replaced with a strip of polishing cloth to serve as a polishing tool.

The polishing tape 23 is wound around the feed reel 24 and is set in the polishing-tape supply mechanism 2A. The polishing tape has one end attached to the take-up reel 25 so that the polishing tape 23 that has been fed to the polishing-head assembly 1A can be taken up by the take-up reel 25. The polishing-head 1A comprises a polishing head 108 that brings the polishing tape 23, fed by the polishing-tape supply mechanism 2A, into contact with the peripheral portion of the substrate 1W. The polishing tape 23 is fed to the polishing head 108 in such a manner the polishing surface of the polishing head 23 faces the substrate W1.

The polishing-tape supply mechanism 2A comprises a plurality of guide rollers 31, 32, 33, and 34 that guide the polishing tape 23 fed to and retracted from the polishing-head assembly 1A. The polishing tape 23 is fed by the feed reel 24 through an opening 20a in the partition wall 20 to the polishing head 108. The polishing tape 23 after use is taken up through the opening 20a by the take-up reel 25.

As shown in FIG. 5, over the substrate W1 is disposed a top supply nozzle 36 that directs a supply of polishing solution toward the center of the top surface of the substrate W1 held by the rotating/holding mechanism 106. There is also a bottom supply nozzle 37 that directs a supply of polishing solution toward the interface between the rear surface of the substrate W1 and the holding stage 4 of the rotating/holding mechanism 106 (that is, toward the periphery of the holding stage 4). The polishing apparatus also comprises a cleaning nozzle 38 for cleaning the polishing head 108 after polishing.

To isolate mechanisms, such as the ball/spline bearing 6 and the radial shaft 18, from the polishing chamber 21 when the hollow shaft 5 is moved vertically relative to the casing 12, as shown in FIG. 5, the hollow shaft 5 and the top end of the casing 12 are connected by a bellows 19 that expands and contracts vertically. In FIG. 5, the hollow shaft 5 is moved down, and the holding stage 4 is at its polishing position.

The partition wall 20 comprises a delivery opening 20b that allows the substrate W1 to move into and out of the polishing chamber 21. The delivery opening 20b is formed in the shape of a horizontal slit. In this way, the substrate W1 held by the carrier, while kept lying horizontally, can be passed through the delivery opening 20 and moved across the polishing chamber 21. The partition wall 20 has an opening 20c and louvres 40 in its top wall and an exit opening (not shown) in its bottom wall. During polishing, the delivery opening 20b can be closed by a shutter (not shown).

As shown in FIG. 4, the polishing head 108 is fixed to an end of an arm 60 that is free to rotate around an axis of rotation Ct parallel to the tangential direction of the substrate W1. The other end of the arm 60 is connected via pulleys p3 and p4 and a belt b2 to a motor M4. As the motor M4 rotates a predetermined angle clockwise or counterclockwise, the arm 60 rotates a predetermined angle around the axis Ct. In this embodiment, the motor M4, arm 60, pulleys p3 and p4, and belt b2 constitute a tilt mechanism that tilts the polishing head 108 relative to the plane of the substrate W1.

The tilt mechanism is mounted on a movable table 61. The movable table 61 is movably connected via a guide 62 and a rail 63 to a base plate 65. The rail 63 extends along a straight line in the radial direction of the substrate W1 held by the rotating/holding mechanism 106 so that the movable table 61 is linearly movable in the radial direction of the substrate W1. To the movable table 61 is attached a coupling plate 66 that passes through the base plate 65, the coupling plate 66 being connected via a joint 68 to a linear actuator 67. The linear actuator 67 is directly or indirectly secured to the base plate 65.

The linear actuator 67, rail 63, and guide 62 constitute a moving mechanism for linearly moving the polishing head 108 in the radial direction of the substrate W1. In other words, the moving mechanism moves the polishing head 108 along the rail 53 toward and away from the substrate W1. The polishing-tape feed mechanism 2A, on the other hand, is fixed to the base plate 65.

Figure 6:
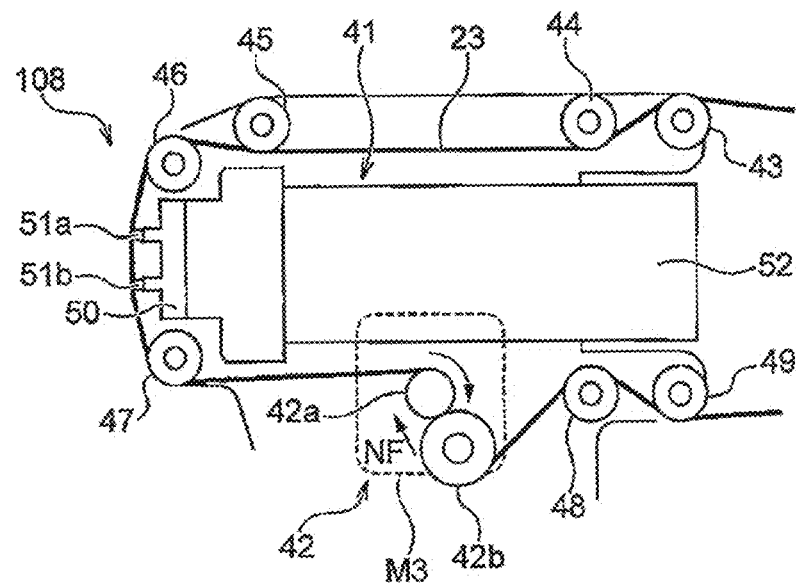
FIG. 6 is an enlarged view of a polishing head.

FIG. 6 is an enlarged view of the polishing head 108. As shown in FIG. 6, the polishing head 108 comprises at least a pressing mechanism 41 that presses the polishing surface of the polishing tape 23 against the substrate W1 with a predetermined force. The polishing head 108 of this embodiment comprises a tape transfer mechanism 42 that transfers the polishing tape 23 from the feed reel 24 to the take-up reel 25. In this embodiment, the polishing head 108 further comprises a plurality of guide rollers 43, 44, 45, 46, 47, 48, and 49, which guide the polishing tape 23 to proceed in a direction perpendicular to the tangential direction of the substrate W1.

The tape transfer mechanism 42 fitted on the polishing head 108 comprises a tape transfer roller 42a, a tape holding roller 42b, and a motor M3 for rotating the tape transfer roller 42a. The motor M3 is fitted on a side surface of the polishing head 108, and the tape transfer roller 42 is fitted to a rotating shaft of the motor M3. The tape holding roller 42b is adjacent to the tape transfer roller 42a. The tape holding roller 42 is supported by an unillustrated mechanism to exert force in the direction of arrow NF in FIG. 6 (toward the tape transfer roller 42a), thereby pressing the tape transfer roller 42a.

As the motor M3 rotates in the direction of the arrow shown in FIG. 6, the tape transfer roller 42a rotates to transfer the polishing tape 23 from the feed reel 24 via the polishing head 108 to the take-up reel 25. The tape holding roller 42b is adapted to rotate around its own axis as the polishing tape 23 is sent to it.

The pressing mechanism 41 comprises: a pressing member 50 disposed on the rear side of the polishing tape 23; and an air cylinder (drive mechanism) 52 for moving the pressing member 50 toward the peripheral portion of the substrate W1. Controlling pneumatic pressure supplied to the air cylinder 52 adjusts the force acting to press the polishing tape 23 against the substrate W1. The tilt mechanisms, the pressing mechanisms 41, and the tape transfer mechanisms 42 of the four polishing-head assemblies 1A, 1B, 1C, and 1D that are disposed around the substrate W1, and moving mechanisms for moving the respective polishing-head assemblies are adapted to operate independently.

Since the substrate W1 is polished by sliding contact with the polishing tape 23, the amount of film removed by the polishing tape 23 is determined by the total length of time of contact with the polishing tape.

Figure 7:
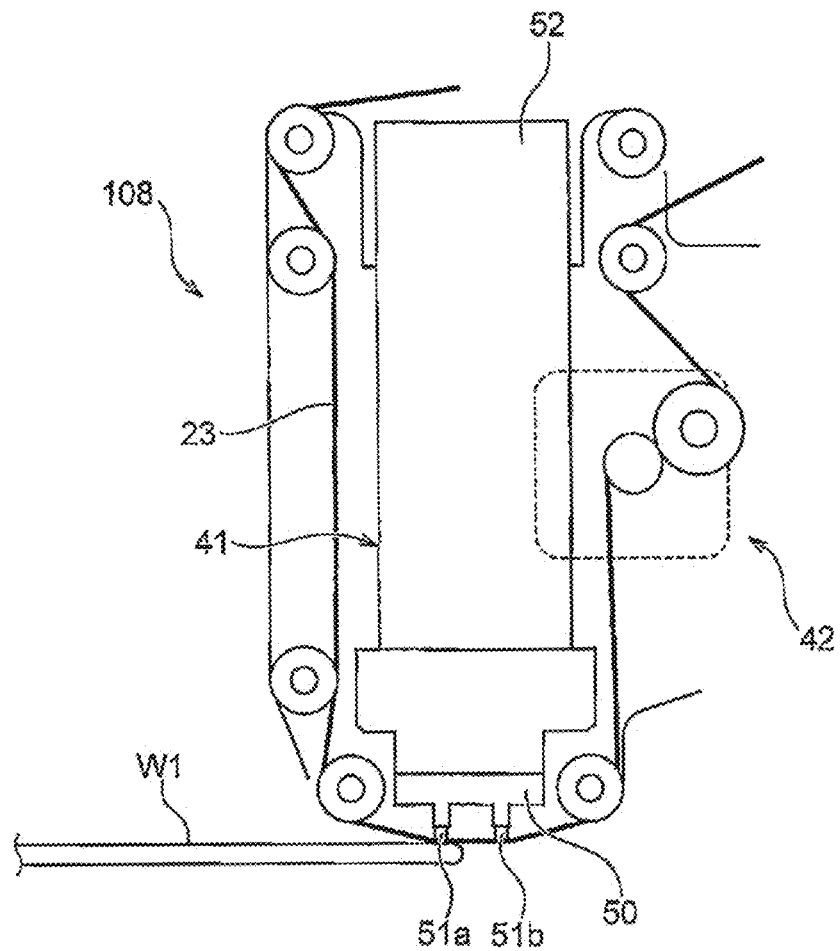
FIG. 7 shows the polishing head when tilted upward by a tilt mechanism.
Figure 8:
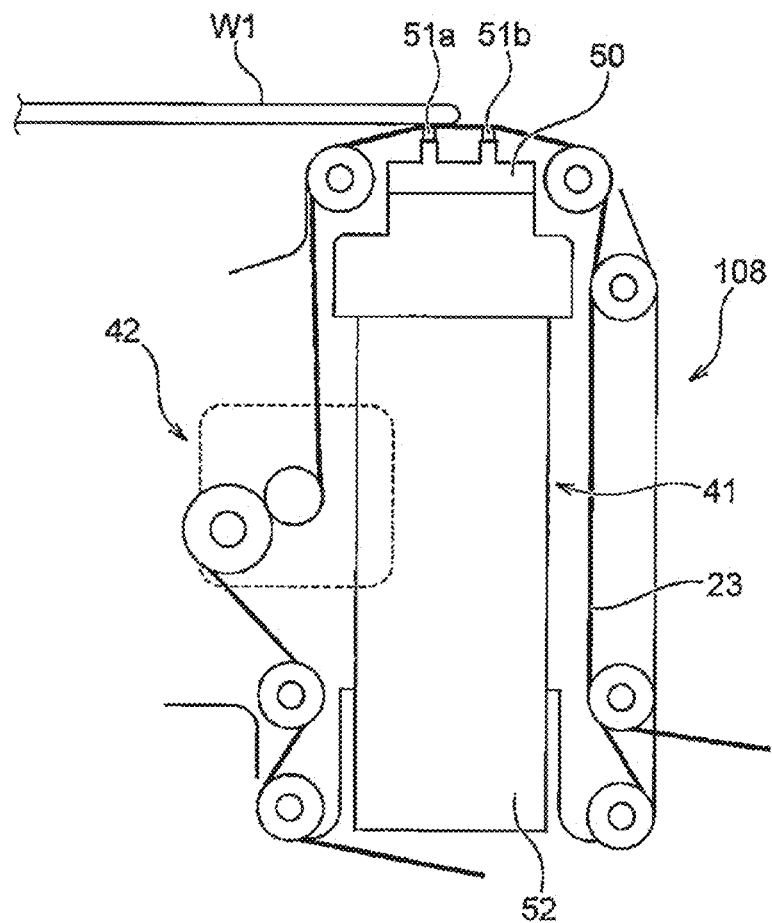
FIG. 8 shows the polishing head when tilted downward by the tilt mechanism.

FIG. 7 shows the polishing head when tilted upward by the tilt mechanism, and FIG. 8 shows the polishing head when tilted downward by the tilt mechanism.

Figure 9:
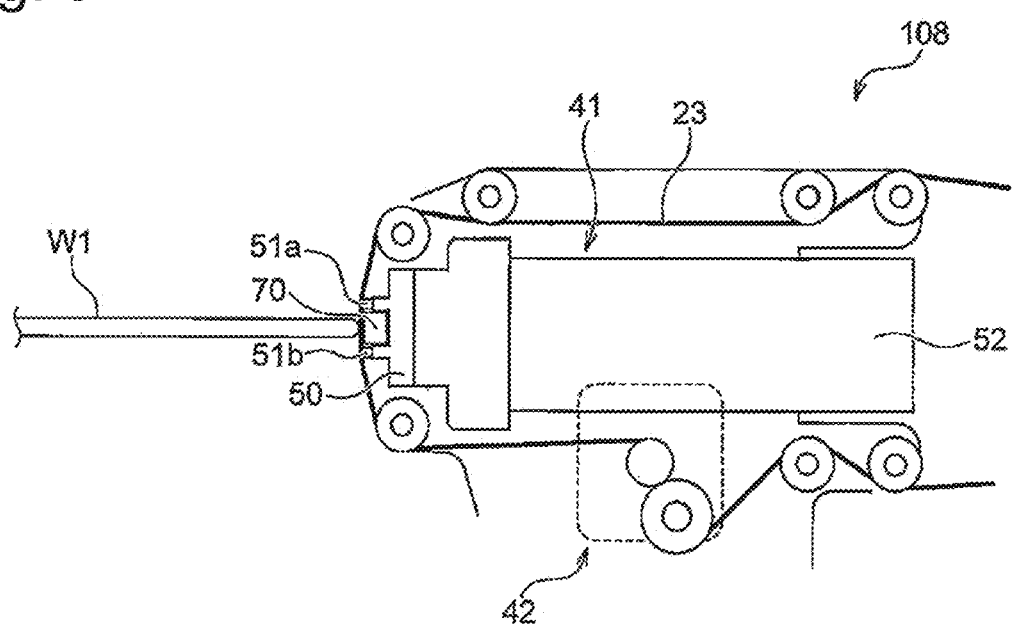
FIG. 9 shoes the polishing head when held horizontally.

FIGS. 7 to 9 show an example of a polishing method using the polishing head 108 having the pressing member 50 of FIG. 7. As shown in FIG. 7, the polishing head 108 is tilted upward for a projection 51a to press the polishing tape 23 against a top edge portion of the substrate, thereby polishing the top edge portion. Subsequently, as shown in FIG. 8, the polishing head 108 is tilted downward for a projection 51b to press the polishing tape 23 against a bottom edge portion of the substrate W1, thereby polishing the bottom edge portion. Then, as shown in FIG. 9, the polishing head 108 is held horizontally (at a tilt angle of 0 degrees to the plane of the substrate W1) for a pressing pad 70 to press the polishing tape 23 against a bevel portion of the substrate W1, thereby polishing the bevel portion.

Figure 1A:
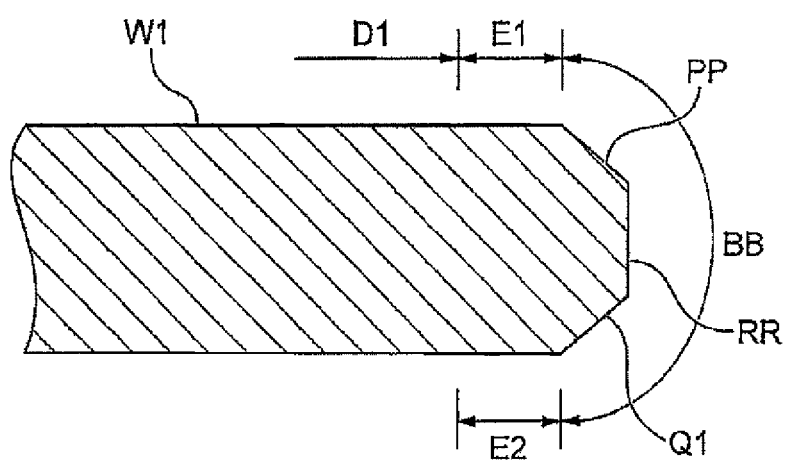
FIG. 1 A is an enlarged cross-sectional views of a peripheral portion of a substrate.
Figure 1B:
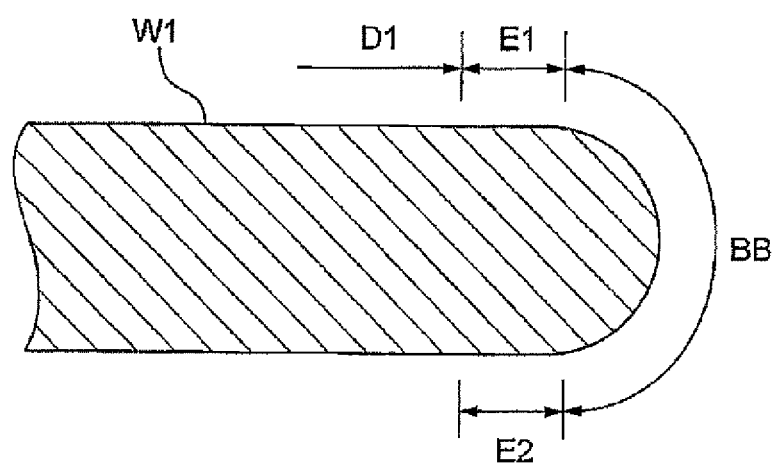
Figure 10:
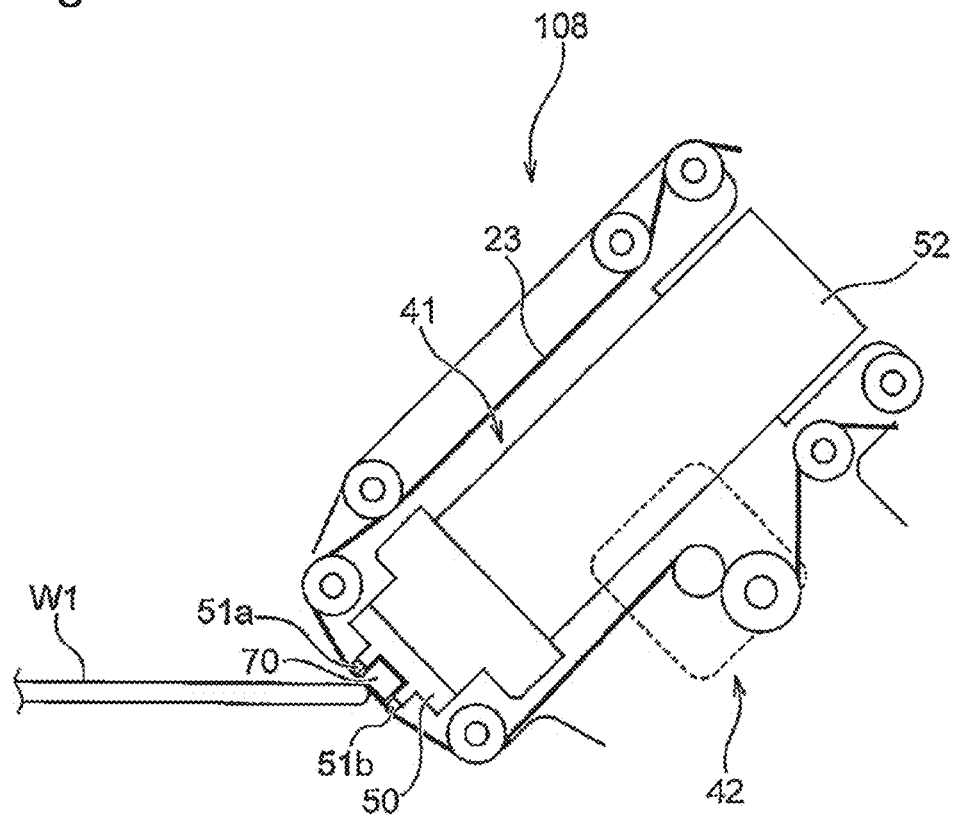
FIG. 10 shows the polishing head tilted upward when polishing a bevel portion of a substrate.
Figure 11:
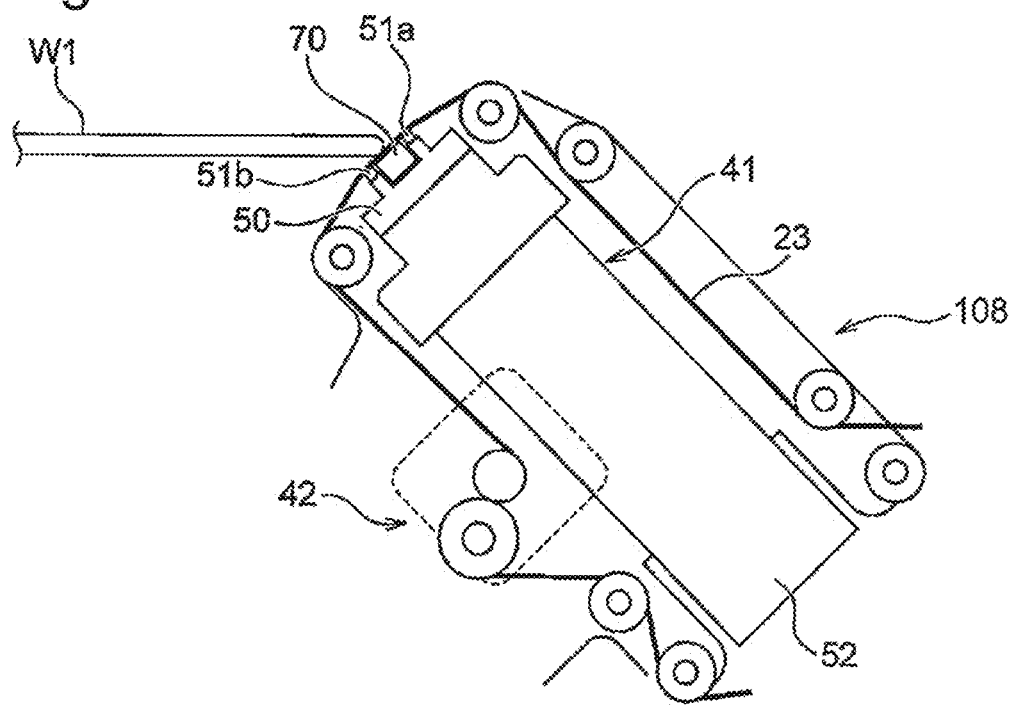
FIG. 11 shows the polishing head tilted downward when polishing the bevel portion of the substrate.
Figure 12:
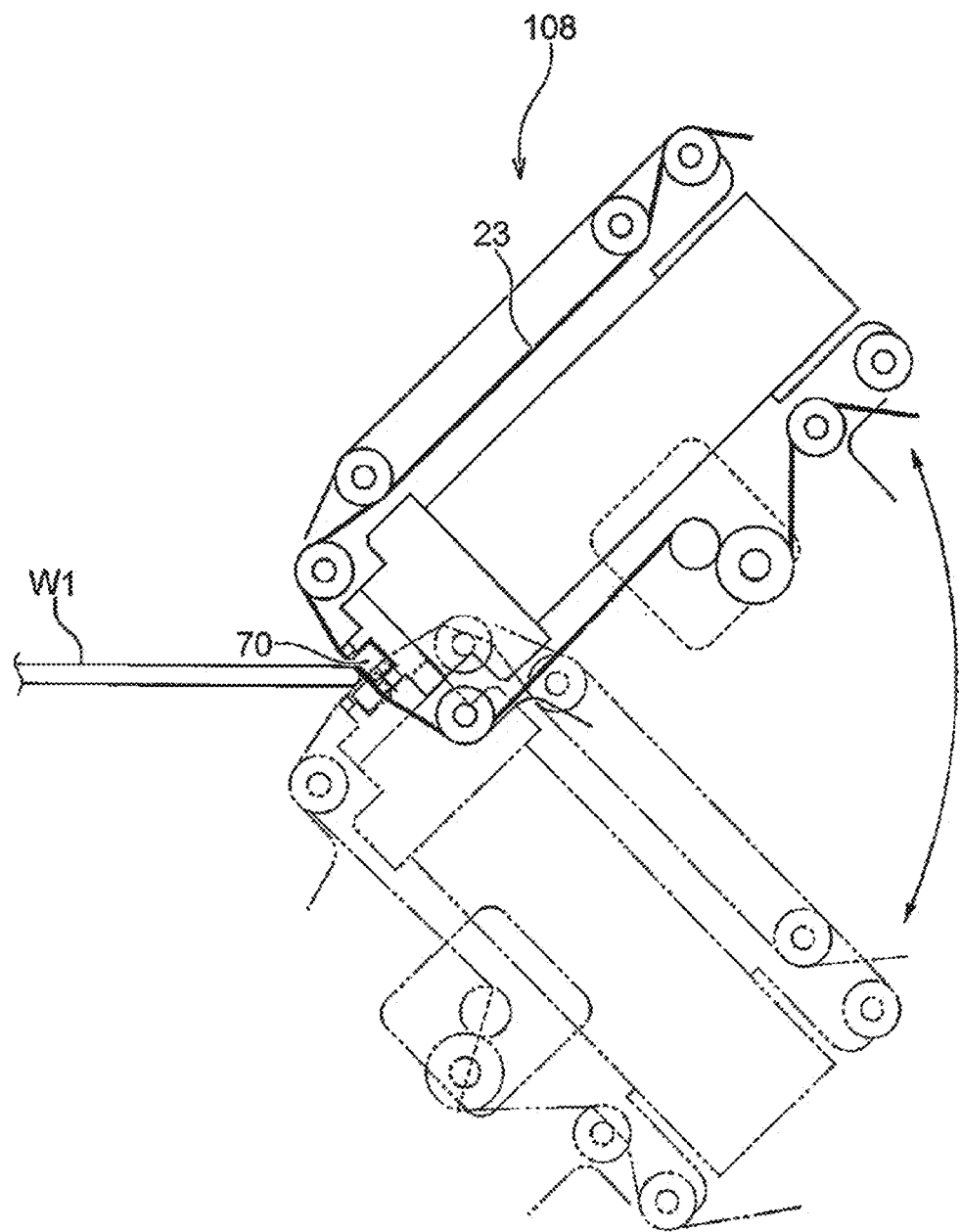
FIG. 12 shows the polishing head tilted at continuously varying angle when polishing the bevel portion of the substrate.

Further, as shown in FIGS. 10 and 11, the bevel portion may be polished while the pressing pad 70 presses the polishing tape 23 obliquely against the bevel portion of the substrate W1, with the polishing head 108 tilted at a certain angle. Tilting the polishing head 108 in such a manner makes it possible to polish the entire bevel portion including a top incline (top bevel portion) PP, a bottom incline (bottom bevel portion) Q1, and a side portion (apex) RR as shown in FIG. 1(a). Further, as shown in FIG. 12, while the pressing pad 70 presses the polishing tape 23 against the bevel portion of the substrate W1, the tilt angle of the polishing head 108 may be continuously changed by the tilt mechanism.

In this manner, the entire peripheral portion of the substrate W1 can be polished with the polishing tape 23, using the pressing member 50 having the projections 51a and 51b and the pressing pad 70.

Figure 13:
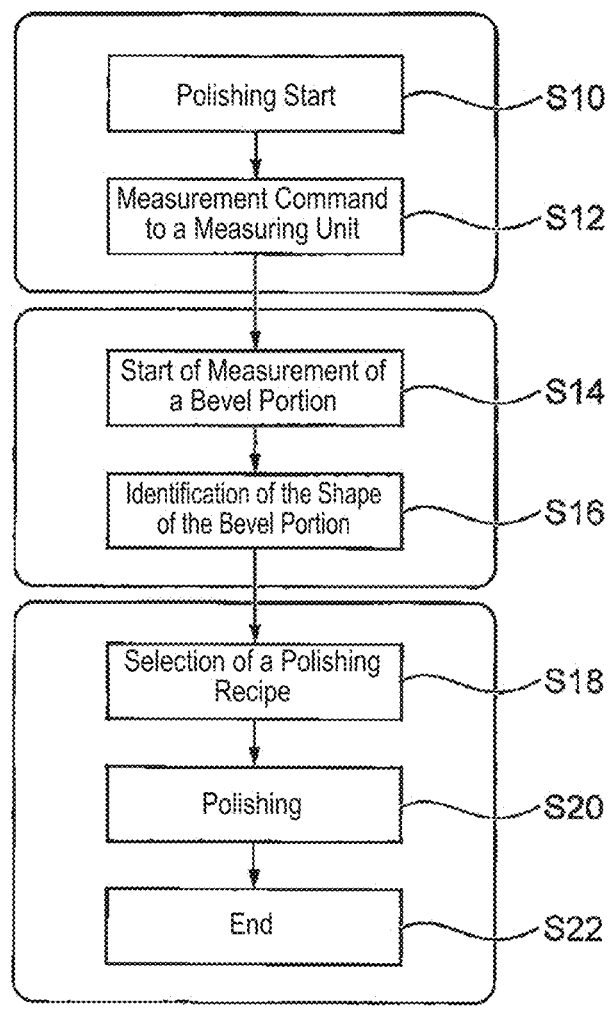
FIG. 13 is a flowchart of the processing steps of this embodiment.

A polishing method using the polishing apparatus of this embodiment will now be described with reference to FIG. 13. FIG. 13 is a flowchart of the processing steps of this embodiment. Once the user inputs a polishing start command to an input device (not shown) of the polishing apparatus 100 (step S10), the control unit 112 instructs the controller 132 of the identifying unit 104 via a signal line 112a to start a measurement of the shape of a bevel portion (step S12). The controller 132 controls a three-dimensional displacement mechanism 120 and confocal laser microscopes 105 and 107 to start recognizing data on the shape of the bevel portion before polishing (step S14).

The controller 132 identifies the cross-sectional shape of the bevel portion as one of the five types, based on the date on the shape of the bevel portion before polishing, and classifies the shape as the type so identified (step S16). The polishing-condition determiner 110 selects a proper polishing recipe from the group of polishing recipes for the five types (step S18). Following the polishing recipe selected, the control unit 112 uses the holder 106 to hold the substrate W1, rotates it, and uses the polisher 108 to press the polishing head against a bevel portion of the substrate W1 and to polish the bevel portion (step S20).

After the polisher 108 polishes the substrate W1 in accordance with the polishing recipe, the polishing-termination determiner 110 determines whether to terminate polishing, based on the data 104b associated with the state of the bevel portion after polishing. Upon determining that the amount of an attached substance is below a predetermined level, the polishing-termination determiner 110 transmits a command for terminating polishing to the control unit 112, which in turn terminates polishing (step S22).

In accordance with this embodiment, even if bevel portions differ in shape, a bevel portion of a given substrate W1 can be polished by selecting a suitable polishing recipe on the basis of a state before polishing.

Although the above embodiment uses the shape of a peripheral portion as a state of the peripheral portion before polishing, the present invention is not limited to this embodiment. As a state of the peripheral portion before polishing, the above-described state of a substance attached to the peripheral portion before polishing may be used instead. The state of a substance attached to the peripheral portion, or the state (i.e., amount, location, or the like) of an unwanted substance, such as film and dust, attached to the peripheral portion is determined by color by the controller 132. More specifically, the controller 132 determines the type or amount of an attached substance by color or tint/shade and classifies the state of the attached substance as one of a plurality of types. The polishing-condition determiner 110 selects a polishing recipe on the basis of type-related information from the controller 132.

REFERENCE SIGNS LIST 1A to 1D: polishing-head assemblies
2A to 2D: polishing-tape supply mechanisms
4: holding stage
24: feed reel
25: take-up reel
41: pressing mechanism
42: tape transfer mechanism
50: pressing member
52: air cylinder
67: linear actuator
100: polishing apparatus
102: holding/polishing unit
104: identifying unit
106: rotating/holding mechanism
108: polishing head
110: polishing-condition determiner
112: control unit

The invention claimed is:
1. A polishing apparatus comprising:
a holder for holding a workpiece;
a polishing member for polishing a peripheral portion of the workpiece while the polishing member is pressed against the peripheral portion;
an identifying unit configured to identify data associated with a cross-sectional shape of the peripheral portion before the polishing and configured to transmit the data, the data indicating which of a plurality of predetermined types of cross-sectional shapes the cross-sectional shape of the peripheral portion belongs to;
a polishing-condition determiner configured to comprise a plurality of predetermined polishing conditions corresponding to the plurality of predetermined types of the cross-sectional shapes, and determine a polishing con- dition among the plurality of predetermined polishing conditions based on the data transmitted from the identifying unit; and a controller for controlling the polishing member to polish the workpiece in accordance with the polishing condition.

2. The polishing apparatus according to claim 1, wherein the identifying unit comprises a confocal laser microscope, and the data associated with the cross-sectional shape of the peripheral portion is obtained by the confocal laser microscope.

3. The polishing apparatus according to claim 1, wherein the identifying unit comprises a telecentric optical system, and the data associated with the cross-sectional shape of the peripheral portion is obtained by the telecentric optical system.

4. The polishing apparatus according to claim 1, further comprising a polishing-termination determiner that, after the polishing member polishes the workpiece, determines whether to terminate the polishing, based on data associated with the cross-sectional shape of the peripheral portion after polishing.

5. The polishing apparatus according to claim 1, wherein the is polishing member polishes a bevel portion that is an end face of the peripheral portion of the workpiece.

6. A polishing method for polishing a peripheral portion of a workpiece by pressing a polishing member against the peripheral portion while the workpiece is held and rotated, the method comprising:

storing a plurality of predetermined polishing conditions corresponding to a plurality of predetermined types of cross-sectional shapes;

identifying data associated with a cross-sectional shape of the peripheral portion before the polishing, the data indicating which of the plurality of predetermined types of cross-sectional shapes the cross-sectional shape of the peripheral portion belongs to;

determining a polishing condition among the plurality of predetermined polishing conditions based on the data associated with the cross-sectional shape of the peripheral portion before the polishing; and polishing the workpiece in accordance with the polishing condition.

7. The polishing apparatus according to claim 1, wherein the identifying unit identifies to which of the plurality of predetermined types the cross-sectional shape of the peripheral portion belongs, based on whether or not the cross-sectional shape has a straight line at its center, whether or not the cross-sectional shape has a slanted straight line, and a length of a curved line.

8. The polishing apparatus according to claim 1, wherein the identifying unit uses a template matching technique to determine a degree of similarity between the cross-sectional shape and the plurality of predetermined types to identify to which of the plurality of predetermined types the cross-sectional shape of the peripheral portion belongs.

9. The polishing method according to claim 6, wherein the identifying step identifies to which of the plurality of predetermined types the cross-sectional shape of the peripheral portion belongs, based on whether or not the cross-sectional shape has a straight line at its center, whether or not the cross-sectional shape has a slanted straight line, and a length of a curved line.

10. The polishing method according to claim 6, wherein the identifying step uses a template matching technique to determine a degree of similarity between the cross-sectional shape and the plurality of predetermined types to identify to which of the plurality of predetermined types the cross-sectional shape of the peripheral portion belongs.

* * * * *